(12) United States Patent
Nakamura et al.

(10) Patent No.: US 12,165,889 B2
(45) Date of Patent: Dec. 10, 2024

(54) OPTICAL HEATING DEVICE

(71) Applicant: Ushio Denki Kabushiki Kaisha, Tokyo (JP)

(72) Inventors: Yoshiaki Nakamura, Tokyo (JP); Tetsuya Kitagawa, Tokyo (JP); Takafumi Mizojiri, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 605 days.

(21) Appl. No.: 17/361,552

(22) Filed: Jun. 29, 2021

(65) Prior Publication Data

US 2022/0013377 A1    Jan. 13, 2022

(30) Foreign Application Priority Data

Jul. 13, 2020   (JP) .................................. 2020-120076

(51) Int. Cl.
*H01L 21/67*   (2006.01)
*H01L 21/26*   (2006.01)
*H05B 1/02*    (2006.01)

(52) U.S. Cl.
CPC ........ *H01L 21/67115* (2013.01); *H01L 21/26* (2013.01); *H05B 1/0233* (2013.01)

(58) Field of Classification Search
CPC .. H05B 1/0233; H01L 21/26; H01L 21/67115
(Continued)

(56) References Cited

U.S. PATENT DOCUMENTS 5,874,711 A * 2/1999 Champetier .......... G01J 5/0003
                                                      359/359
7,102,141 B2 * 9/2006 Hwang ............... H01L 21/2686
                                                      438/455
(Continued)

FOREIGN PATENT DOCUMENTS

JP    H10-082589 A    3/1998
JP    2005-005448 A   1/2005
(Continued)

OTHER PUBLICATIONS

An Office Action; "Notice of Reasons for Refusal," mailed by the Japanese Patent Office on Dec. 21, 2023, which corresponds to Japanese Patent Application No. 2020-120076 and is related to U.S. Appl. No. 17/361,552; with English language translation.

(Continued)

*Primary Examiner* — Jimmy Chou
(74) *Attorney, Agent, or Firm* — Studebaker & Brackett PC

(57) ABSTRACT

An optical heating device for heating a substrate includes:
 a chamber for accommodating the substrate;
 a support member for supporting the substrate in the chamber;
 a flash lamp disposed to face a first main surface of the substrate supported by the support member;
 a plurality of LED elements for emitting light from outside a flash light irradiation space that is sandwiched between the substrate supported by the support member and the flash lamp, the light traveling toward the first main surface of the substrate or a second main surface of the substrate that is the opposite side of the first main surface; and
 a light blocking member disposed between the flash lamp and a plurality of the LED elements in a separating direction, and outside the flash light irradiation space, (Continued)

for blocking the light emitted from the flash lamp and traveling toward a plurality of the LED elements.

5 Claims, 9 Drawing Sheets

(58) Field of Classification Search
USPC .......................................................... 392/416
See application file for complete search history.

(56) References Cited

U.S. PATENT DOCUMENTS

| | | | | |
|---|---|---|---|---|
| 8,404,499 | B2* | 3/2013 | Moffatt | H01L 21/67115 219/390 |
| 8,624,165 | B2* | 1/2014 | Kusuda | H01L 21/67115 219/390 |
| 8,859,443 | B2* | 10/2014 | Yokouchi | H01L 21/68742 392/407 |
| 11,881,420 | B2* | 1/2024 | Yamada | H01L 21/68757 |
| 2006/0065849 | A1* | 3/2006 | Hwang | H01J 61/40 257/E21.349 |
| 2009/0180766 | A1 | 7/2009 | Kusuda | |
| 2009/0245761 | A1* | 10/2009 | Nakajima | F27B 17/0025 392/416 |
| 2010/0258729 | A1* | 10/2010 | Roxburgh | G08C 23/04 250/340 |
| 2010/0267174 | A1 | 10/2010 | Moffatt | |
| 2012/0067864 | A1* | 3/2012 | Kusuda | H01L 21/67115 219/385 |
| 2012/0238110 | A1* | 9/2012 | Yokouchi | H01L 21/68785 257/E21.333 |
| 2012/0244725 | A1* | 9/2012 | Fuse | H01L 21/68742 257/E21.333 |
| 2012/0288261 | A1* | 11/2012 | Hashimoto | F27D 5/0037 392/416 |
| 2013/0203269 | A1 | 8/2013 | Yokouchi | |
| 2013/0259457 | A1* | 10/2013 | Yokouchi | H01L 21/68785 392/416 |
| 2013/0337661 | A1* | 12/2013 | Kato | H01L 21/28185 392/416 |
| 2014/0329340 | A1* | 11/2014 | Yokouchi | H01L 21/67115 392/416 |
| 2015/0311080 | A1* | 10/2015 | Yokouchi | H05B 3/0047 392/416 |
| 2016/0195333 | A1* | 7/2016 | Kawarazaki | H01L 21/02345 438/761 |
| 2016/0262207 | A1* | 9/2016 | Abe | F27D 11/12 |
| 2017/0178979 | A1* | 6/2017 | Furukawa | H05B 1/0233 |
| 2017/0243770 | A1* | 8/2017 | Abe | H05B 3/0047 |
| 2017/0243771 | A1* | 8/2017 | Abe | H01L 21/67115 |
| 2017/0309529 | A1 | 10/2017 | Aderhold et al. | |
| 2018/0005848 | A1* | 1/2018 | Aoyama | H01L 21/67207 |
| 2018/0202071 | A1* | 7/2018 | Kawarazaki | H01L 21/02345 |
| 2019/0164789 | A1* | 5/2019 | Aoyama | C23C 16/45557 |
| 2019/0267262 | A1* | 8/2019 | Aoyama | C23C 16/482 |
| 2020/0211851 | A1* | 7/2020 | Nozaki | H01L 22/20 |
| 2020/0286756 | A1* | 9/2020 | Ueda | H01L 21/67115 |
| 2020/0328083 | A1* | 10/2020 | Ueda | H01L 21/2254 |
| 2021/0151335 | A1* | 5/2021 | Miyake | H01L 21/6719 |
| 2022/0013377 | A1* | 1/2022 | Nakamura | H01L 21/26 |
| 2023/0207348 | A1* | 6/2023 | Ono | H01L 21/67115 392/418 |

FOREIGN PATENT DOCUMENTS

| | | |
|---|---|---|
| JP | 2006-324389 A | 11/2006 |
| JP | 2009-164525 A | 7/2009 |
| JP | 2009-231661 A | 10/2009 |
| JP | 2012-524400 A | 10/2012 |
| JP | 2013-074255 A | 4/2013 |
| JP | 2013-161934 A | 8/2013 |
| JP | 2017-117862 A | 6/2017 |
| KR | 10-2012-0006553 A | 1/2012 |
| WO | 2010/123772 A2 | 10/2010 |

OTHER PUBLICATIONS

An Office Action issued by Taiwan Intellectual Property Office on Dec. 27, 2023, which corresponds to Taiwanese U.S. Appl. No. 17/361,552 and is related to U.S. Appl. No. 17/361,552; with English language translation.

An Office Action mailed by the Japanese Patent Office on Jun. 4, 2024, which corresponds to Japanese Application No. 2020-120076 with English translation.

An Office Action mailed by the Korean Intellectual Property Office on Oct. 1, 2024, which corresponds to Korean Patent Application No. 10-2021-0085417 and is related to U.S. Appl. No. 17/361,552; with English language translation.

* cited by examiner

OPTICAL HEATING DEVICE

TECHNICAL FIELD

The present invention relates to an optical heating device.

BACKGROUND ART

In the heating treatment of semiconductor substrates, optical heating devices using halogen lamps are commonly used. In recent years, there has been a demand for forming thin impurity diffusion layers in the semiconductor manufacturing process, together with miniaturization and high integration, thus a heating device that can perform uniform heating treatment in a short time has been requested.

In the semiconductor manufacturing process, the ion implantation method, in which impurities are introduced into Si crystals by ion implantation, is commonly used. This method involves heating semiconductor substrates to 1000° C. or higher in order to restore from crystal defects generated during the ion implantation.

In the case of microfabrication process, the annealing process of the semiconductor substrate is preferably completed in a short time to minimize thermal diffusion on the semiconductor substrate in order to form a thin impurity diffusion layer. Hence, an optical heating device using flash lamps, for example, as described in Patent Document 1 below, is adopted for annealing semiconductor substrates in micro fabrication process.

CITATION LIST

Patent Document

Patent Document 1: JP-A-2006-324389

SUMMARY OF INVENTION

Technical Problem

When a semiconductor substrate is instantaneously heated or cooled in a range between room temperature and 1,000° C. or higher, the semiconductor substrate suddenly expands and contracts in accordance with the temperature variation, which may cause the semiconductor substrate to warp and crack. Hence, the optical heating device described in Patent Document 1 above employs a configuration in which a halogen lamp is used to preheat the semiconductor substrate to a temperature at which the thermal diffusion of impurities is not an issue in the entire semiconductor substrate. This configuration enables variation in the temperature of the semiconductor substrate to reduce during the flash lamp heating, suppressing the semiconductor substrate from warping and cracking. Here, the term "preheating" refers to heating the semiconductor substrate to a predetermined temperature using another light source before the heating treatment with a flash lamp.

The inventors of the present invention have extensively studied conventional optical heating devices for improvements on the following. Hereinafter, the details are described below with reference to the drawings.

FIG. 11 is a schematic view illustrating a configuration of a conventional optical heating device 100 provided with a chamber 101, flash lamps 102 and halogen lamps 103.

The chamber 101 includes a light transmissive window 104 to allow light emitted from the flash lamps 102 and the halogen lamps 103 to enter inside the chamber 101. The chamber 101 also includes a support base 105 to support a semiconductor substrate W1 to be heated in the chamber 101. In the case of vacuuming the chamber 101, the light transmissive window 104 is hermetically sealed with an O-ring or the like; however such a structure is omitted in FIG. 11.

The halogen lamps 103 are lit before the heating by the flash lamps 102 is performed, and preheats the semiconductor substrate W1 until its temperature stabilizes a predetermined temperature.

Here, the inventors studied the light source for preheating to be replaced with LED elements from the halogen lamps 103 for the purpose of increasing the speed of preheating, extending the service life of the optical heating device 100, and reducing its power consumption; and found the following problems.

The flash lamps 102 emit light toward the semiconductor substrate W1 with high energy enough to instantaneously heat the main surface of the semiconductor substrate W1 to 1000° C. or higher. However, not all of the light emitted from the flash lamps 102 irradiates the semiconductor substrate W1, and a part of the light irradiates an area other than the semiconductor substrate W1.

When the LED elements are irradiated with light emitted from the flash lamps 102, they are heated in the same way as the semiconductor substrate W1, and may be damaged. For this reason, halogen lamps 103 could not simply be replaced with LED elements as a light source for preheating in the conventional optical heating system 100.

In view of the above problem, it is an object of the present invention to provide an optical heating device provided with the flash lamps and the LED elements.

Solution to Problem

An optical heating device according to the present invention is an optical heating device for heating a substrate, the optical heating device comprising:
- a chamber for accommodating the substrate;
- a support member for supporting the substrate in the chamber;
- a flash lamp disposed to face a first main surface of the substrate supported by the support member;
- a plurality of LED elements for emitting light from outside a flash light irradiation space that is sandwiched between the substrate supported by the support member and the flash lamp, the light traveling toward the first main surface of the substrate or a second main surface of the substrate, the second main surface being the opposite side of the first main surface; and
- a light blocking member disposed between the flash lamp and a plurality of the LED elements in a separating direction, and outside the flash light irradiation space, for blocking the light emitted from the flash lamp and traveling toward a plurality of the LED elements.

The LED elements are arranged to emit light from outside the flash light irradiation space that is sandwiched between the substrate supported by the support member and the flash lamp, the light traveling toward the first or second main surface of the substrate. The light blocking member is disposed between the flash lamp and the LED elements in the separating direction to block the light emitted from the flash lamp and traveling toward the LED elements.

Herein, the "flash light irradiation space" refers to the space sandwiched between the substrate supported by the support member and the flash lamp. A detailed description of the flash light irradiation space will be described in the "DESCRIPTION OF EMBODIMENTS" later, with reference to FIGS. 1 and 2.

The term "blocking light" in this document is a concept that includes not only blocking light in the full spectral range, but also blocking light in a part of the wavelength band of the light emitted from the flash lamp.

In the above configuration, the light emitted from the flash lamp fails to irradiate the LED elements directly, thus preventing the LED elements from being damaged by the light emitted from the flash lamp. Since the light blocking member is disposed outside the flash light irradiation space, it does not block the light emitted from the flash lamp and traveling directly toward the substrate.

In addition to the preheating, the LED elements provided in the optical heating device of the above configuration may be used, for example, to irradiate the substrate with light to prevent a sudden drop in temperature after the heating treatment by the flash lamp, or to intensively heat the peripheral area of the substrate where the temperature tends to drop.

In the above optical heating device, the light blocking member may be a glass material with a dielectric multilayer film formed on its surface.

Furthermore, in the above optical heating device, a plurality of the LED elements may be arranged to emit light toward the second main surface of the substrate, and the light blocking member may be disposed between the substrate supported by the support member and the LED elements.

The wavelength bandwidth, in which the relative intensity to the peak light intensity of the spectrum of light is 50% or more, is very narrow in the light emitted from the LED element compared to the light emitted from the flash lamp, as shown in FIG. 9, which is referred to in the "DESCRIPTION OF EMBODIMENTS". The light blocking member may be configured to transmit only light having a wavelength range corresponding to the spectrum of the light emitted from the LED elements. This configuration, among the light emitted from the LED elements, allows only the light with the wavelength range having high light intensity to be transmitted through the light blocking member and the light with the other wavelength range to be blocked.

Optical components that transmit light with only a predetermined wavelength range are composed of a dielectric multilayer film, each layer having a predetermined thickness and being formed on the surface of a glass material. In other words, the light blocking member described above may allow only light with a predetermined wavelength range to be transmitted according to the spectrum of the light emitted from the LED element.

Hence, the above configuration allows the light emitted from the LED elements to sufficiently irradiate the substrate. The above configuration, in contrast, blocks the light emitted from the flash lamp and traveling toward the LED elements in the predetermined wavelength range. Therefore, not all the light emitted from the flash lamp is directly irradiated to the LED elements, preventing the LED elements from being damaged.

In the above optical heating device, a plurality of the LED elements may be arranged to emit light toward the second main surface of the substrate, and the light blocking member may be disposed to communicate the side surface of the substrate supported by the support member with the inner wall surface of the chamber.

The light blocking member in the above configuration is configured as a wall that divides the chamber into the space in which the flash lamp is disposed and the space in which the LED elements are disposed. The light blocking member is provided with a hole into which the substrate fits, thus separating the space in which the flash lamp is disposed from the space in which the LED element is disposed.

There is no issue on the light traveling from the space in which the flash lamp is placed to the space in which the LED element is placed, as long as the light is not intense enough to damage the LED elements. In this case, there may be a small gap between the substrate and the light blocking member, and between the light blocking member and the inner wall surface of the chamber. Specifically each of the gap between the substrate and the light blocking member, and between the light blocking member and the inner wall surface of the chamber may have a maximum gap of 5.0 mm.

However, it is preferable that the sides of the substrate be configured to be in contact with the light blocking member all the way around without a gap to prevent light from passing from the space in which the flash lamp is disposed to the space in which the LED elements are disposed. For example, it is preferable that the light blocking member be integrally configured with the chamber to prevent a gap between the light blocking member and the inner wall surface of the chamber.

The above configuration allows the light emitted from the flash lamp and traveling toward the LED element, either directly or after reflecting at the inner wall surface of the chamber, to be blocked by the substrate and light blocking member. Therefore, the LED elements are not irradiated with the light emitted from the flash lamp at all, or are irradiated with only a small portion of the light, thus suppressing the LED elements from being damaged by the light emitted from the flash lamp.

The above optical heating device may include a plurality of the LED elements arranged to emit light toward the second main surface of the substrate; the light blocking member disposed between the substrate supported by the support member and a plurality of the LED elements, being a member that is openable and closable, and being configured to switch over between a state in which light is allowed to pass through and a state in which light is blocked by opening and closing the light blocking member, respectively; and an opening/closing control unit that controls the light blocking member to close before the flash lamp is lit.

In the above configuration, the light blocking member is configured to prevent the light emitted from the LED elements from being irradiated on the second main surface of the substrate only when the flash lamp is lit. As a result, the light emitted from the LED elements is irradiated on the second main surface of the substrate during preheating, and the light emitted from the flash lamp is blocked to reach the LED elements during the lighting of the flash lamp.

In the above optical heating device, a plurality of the LED elements are disposed in the opposite side where the substrate supported by the support member is located as seen from the flash lamp, and the light blocking member may be a reflector that allows the light emitted from the flash lamp and traveling toward the LED elements to be reflected toward the side of the substrate.

In the above configuration, the reflector allows the light emitted from the flash lamp and traveling toward the LED elements disposed in the opposite side of the substrate to be reflected toward the substrate. In other words, the light emitted from the flash lamp and traveling toward the LED element is blocked by the reflector. As a result, the light emitted from the flash lamp is not directly irradiated to the LED elements.

Moreover, this configuration eliminates the need for an individual space for the flash lamp and LED elements, and allows them to be disposed in close proximity to each other, thereby making the entire device more compact.

Advantageous Effects

The present invention provides an optical heating device provided with a flash lamp and LED elements.

DESCRIPTION OF EMBODIMENTS

Hereinafter, embodiments of the optical heating device in accordance with the present invention will now be described with reference to the drawings. It is noted that the each of the following drawings is merely schematically illustrated. In other words, the dimensional ratios and the number of parts on the drawings do not necessarily match the actual dimensional ratios and the actual number of parts.

First Embodiment

Figure 1A:
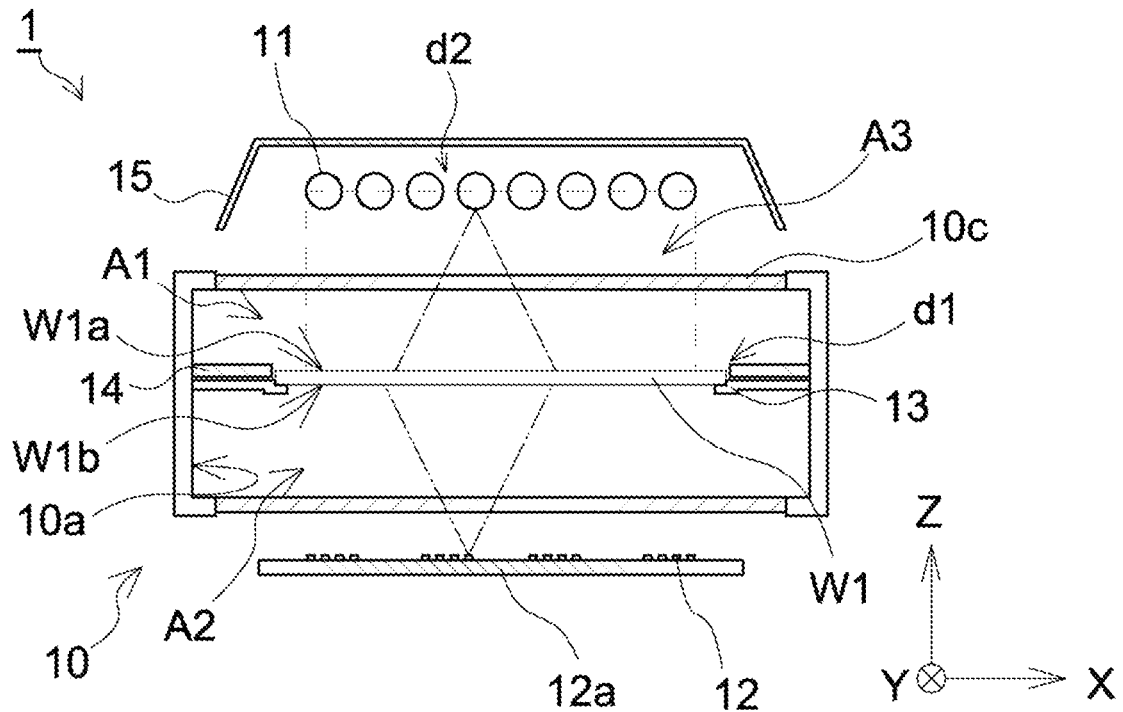
FIG. 1A is a schematic cross-sectional view of an optical heating device illustrating an embodiment.
Figure 2:
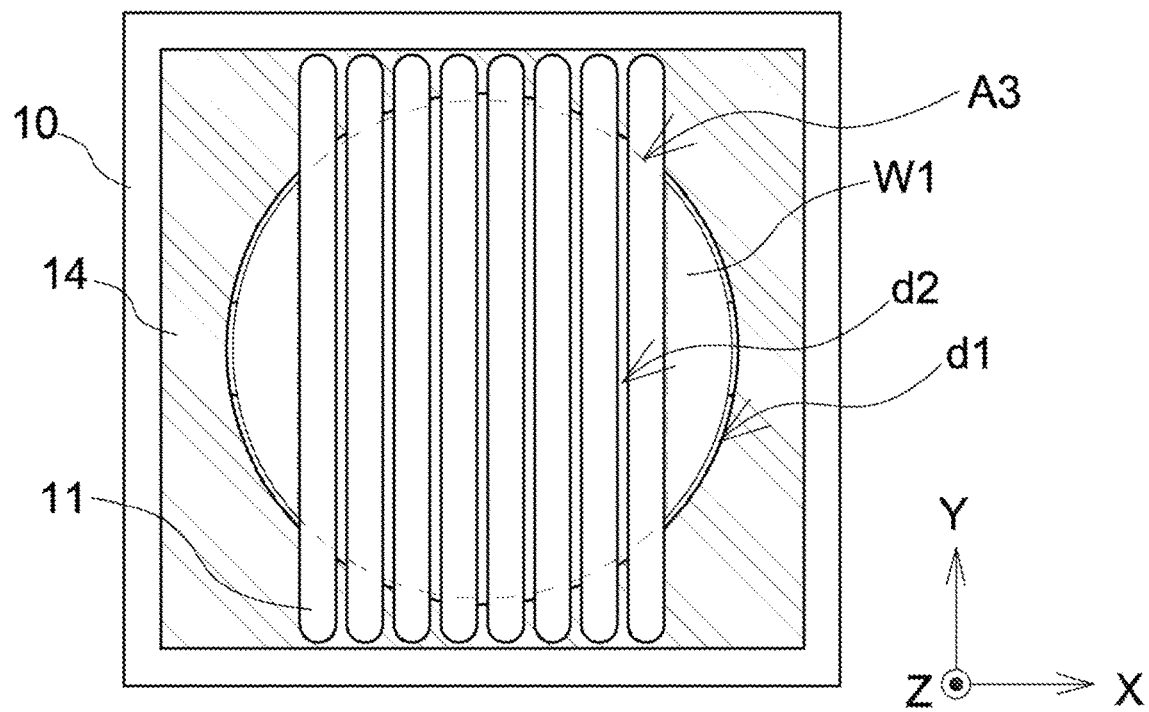
FIG. 2 is a plan view of the optical heating device in FIG. 1A, viewed from the +Z side, excluding a reflector.

FIG. 1A is a schematic cross-sectional view of an optical heating device 1 illustrating an embodiment. FIG. 2 is a plan view of the optical heating device in FIG. 1A, viewed from the +Z side, excluding a reflector. As shown in FIG. 1A, the optical heating device 1 of the first embodiment includes a chamber 10 in which a semiconductor substrate W1 is accommodated, a plurality of flash lamps 11, a plurality of LED elements 12, a support member 13, a light blocking member 14, and a reflector 15.

Hereinafter, as shown in FIGS. 1A and 2, the X direction is defined as a direction in which the multiple flash lamps 11 are arranged, the Y direction as a direction in which the flash lamps 11 each extend, and the Z direction as the direction orthogonal to the X and Y directions. In the case of describing a direction to distinguish a positive direction from a negative direction, a positive or negative sign is added to the direction, such as "+Z direction" or "−Z direction". In the case of describing a direction without distinguishing a positive direction from a negative direction, the direction is simply expressed as "Z direction".

As shown in FIG. 1A, a chamber 10 is provided with a support member 13 that supports a semiconductor substrate W1 thereinside. The support member 13 supports the semiconductor substrate W1 so as to place the main surfaces (W1a, W1b) of the semiconductor substrate W1 on the XY plane. As shown in FIG. 1A, the chamber 10 of the first embodiment is provided with a light transmissive window 10c to allow the light for heating emitted from each light source located outside the chamber 10 to enter inside the chamber 10. The light transmissive window 10c is made of, for example, glass. In the drawing viewed from the Z direction as shown in FIG. 2, the light transmissive window 10c is omitted to describe the arrangement relationship of each component.

Figure 1B:
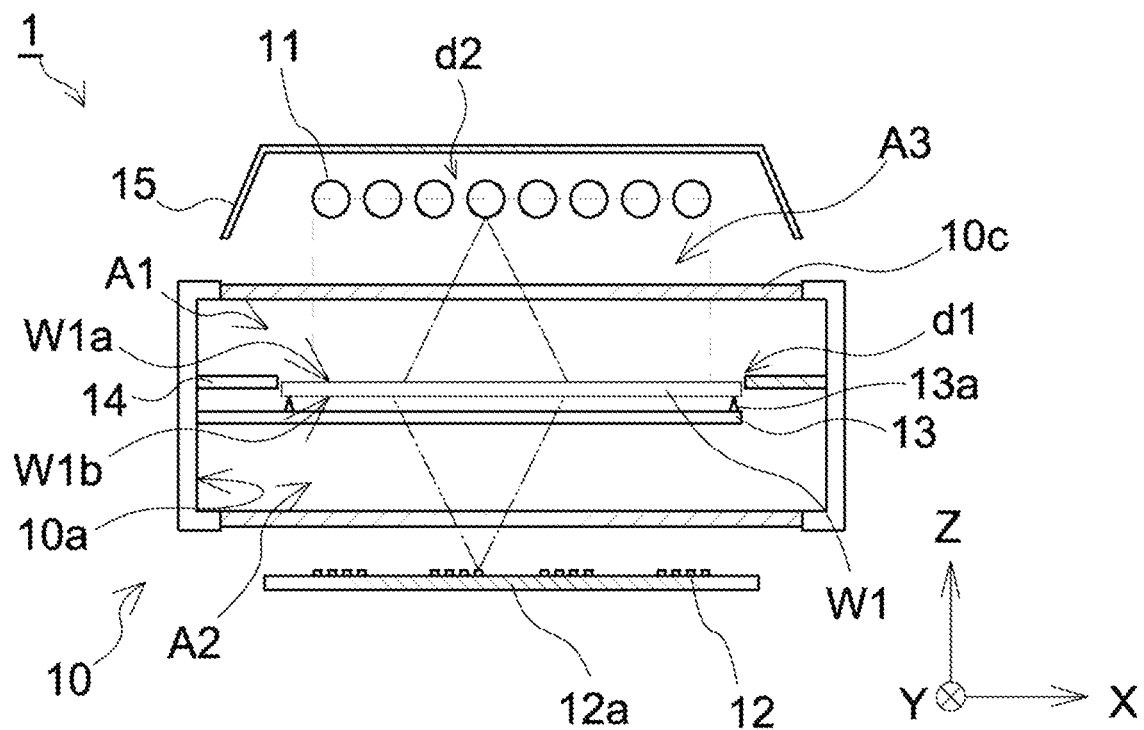
FIG. 1B is a schematic cross-sectional view of an optical heating device illustrating an embodiment.

FIG. 1B is a schematic cross-sectional view of an optical heating device illustrating another embodiment. The support member 16 can be any configuration as long as the main surfaces (W1a, W1b) of the semiconductor substrate W1 are placed on the XY plane; for example, the support member 13 may include a plurality of pin-shaped protrusions on which the semiconductor substrate W1 is supported at their tips.

Here, the main surface W1a refers to a surface on which circuit elements, wirings, and so forth are formed, and the surface being irradiated with the light emitted from the flash lamps 11; whereas the main surface W1b refers to a surface that is irradiated with the light emitted from the LED elements 12 for preheating.

As shown in FIGS. 1A and 2, the chamber 10 of the embodiment has a rectangular parallelepiped shape that appears to be a quadrangle when viewed from the Z direction; however it may have any other shapes including a polygonal column shape that appears to be a polygon other than a quadrangle such as a hexagon or an octagon when viewed from the Z direction, or a circular cylinder shape or an elliptical cylinder shape that appear to be a circle or an ellipse when viewed from the Z direction. No light transmissive window 10c may be provided in the chamber 10 in the case that there is no need for the light transmissive window 10c, including the case that the flash lamps 11 and LED elements 12 being disposed inside the chamber 10.

As shown in FIG. 1A, the light emitted from the flash lamps 11 irradiate the main surface W1a of the semiconductor substrate W1, whereas the light emitted from the LED elements irradiate the main surface W1b of the semiconductor substrate W1.

When the flash lamp 11 is triggered to start discharging by the power necessary for lighting being supplied between the electrodes, which are not shown in the figure, an electric discharge occurs in the light-emitting tube, and the flash lamp 11 emits a flash of light toward the first main surface W1a of the semiconductor substrate W1. The flashed light emitted from the flash lamps 11 irradiates the main surface W1a of the semiconductor substrate W1, heating the semiconductor substrate W1 instantaneously (e.g., 0.1 msec to 100 msec) to 1000° C. or higher.

Figure 3A:
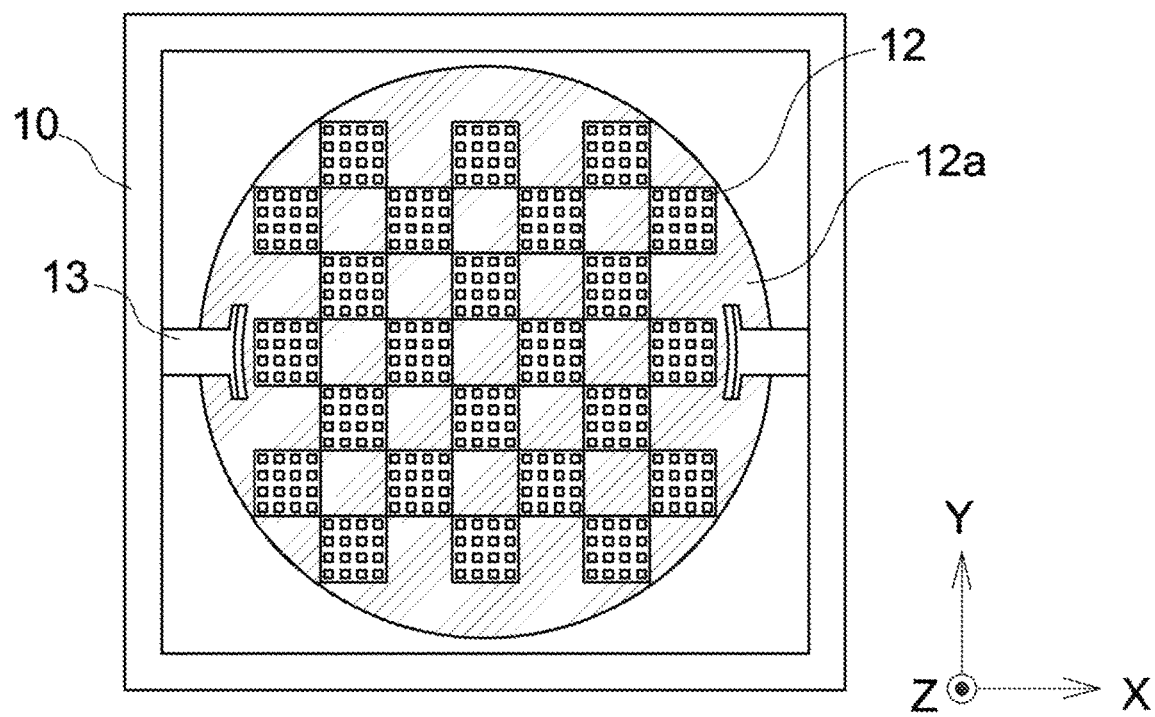
FIG. 3A is a plan view of the optical heating device in FIG. 2, further excluding flash lamps, a light blocking member and a semiconductor substrate.
Figure 3B:
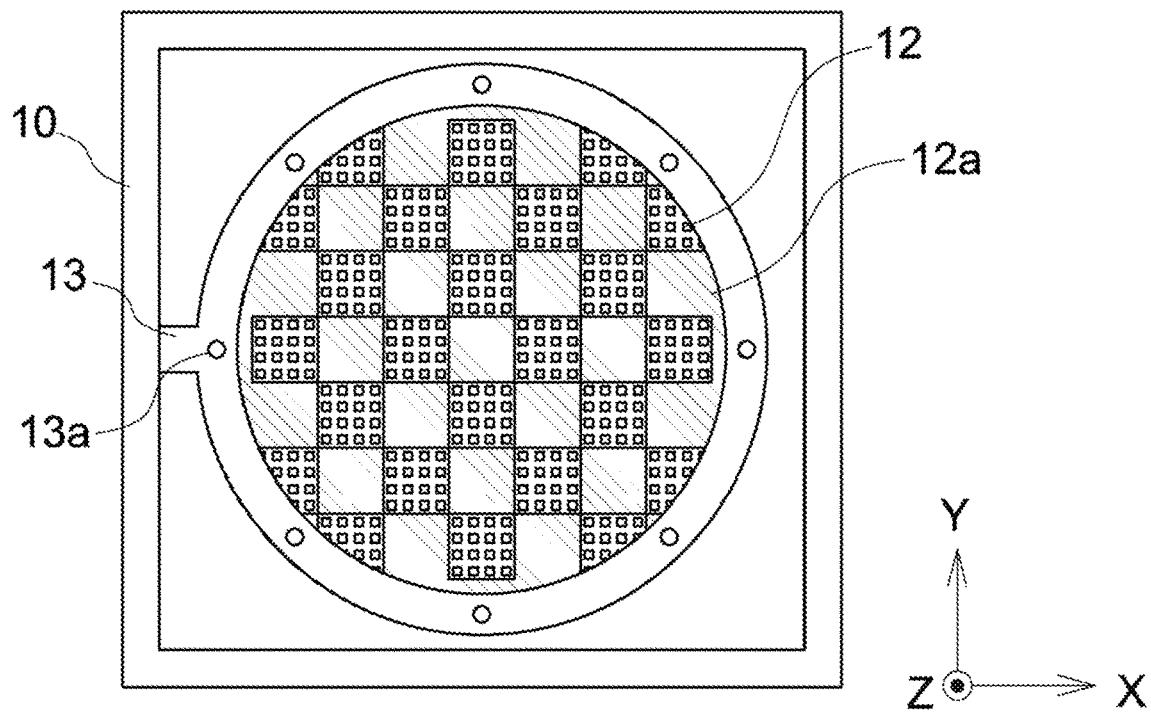
FIG. 3B is a plan view of the optical heating device in FIG. 1B, viewed from the +Z side, excluding a reflector, flash lamps, a light blocking member and a semiconductor substrate.

FIG. 3A is a plan view of the optical heating device 1 in FIG. 2, excluding the flash lamps 11, the light blocking member 14 and the semiconductor substrate W1. FIG. 3B is a plan view of the optical heating device 1 in FIG. 1B, viewed from the +Z side, excluding the reflector 15, the flash lamps 11, the light blocking member 14 and the semiconductor substrate W1. As shown in FIGS. 3A and 3B, the LED board 12a has a plurality of LED elements 12 arranged on its XY plane. As shown in FIG. 1A, the light emitted from the LED elements travels toward the second main surface W1b on the semiconductor substrate W1.

In the optical heating device 1 of the first embodiment, as shown in FIGS. 1A and 3A, LED board 12a has the multiple LED elements 12 arranged coplanarly thereon; however the LED board 12a may constitute a curved surface and have the LED elements 12 arranged thereon. The multiple LED boards 12a may be provided in the optical heating device 1.

The light blocking member 14, as shown in FIG. 1A, is disposed to communicate the side surface of the semiconductor substrate W1 with the inner wall surface of the chamber 10. The light blocking member 14, as shown in FIG. 2 and viewed from the +Z side, has an annular shape with a hole into which the semiconductor substrate W1 fits.

This configuration allows the light blocking member 14 to divide the space A1 that the light emitted from the flash lamps 11 irradiates, from the space A2 that the light emitted from the LED element 12 irradiates. The light emitted from the flash lamps 11 and traveling toward the outside of the semiconductor substrate W1 without irradiating it, is blocked by the light blocking member 14, preventing the light from traveling toward the LED element 12. Hence, the light blocking member 14 serves to block the light emitted from the flash lamps 11 and traveling toward the LED elements 12 instead of traveling toward the semiconductor substrate W1.

As shown in FIG. 2, a small gap d1 is formed between the semiconductor substrate W1 and the light blocking member 14. The gap d1 should preferably be eliminated; however, it is difficult to configure the optical heating device 1 without any gap d1 for all semiconductor substrates W1 due to variations in the size of semiconductor substrates W1 and so forth.

Hence, the optical heating device 1 should be configured with a gap d1 of 5.0 mm or less, given that the amount of light emitted from the flash lamps 11 and reaching the LED elements 12 is reduced to the extent that the LED elements 12 are not damaged.

Furthermore, the space A3 encircled with a dashed line in FIG. 1A is a space sandwiched between the semiconductor substrate W1 supported by the support member 13 and the flash lamps 11. In this space, the light emitted from the flash lamps travels directly toward the semiconductor substrate W1. Hereinafter, the space A3 will be referred to as "flash light irradiation space A3".

The region of the flash light irradiation space A3 in the XY plane, as shown in FIG. 2, is an area where the flash lamps 11 and the semiconductor substrate W1 overlap when viewed from the Z direction.

As shown in FIGS. 1A and 2, the flash light irradiation space A3 also includes the space sandwiched between the gap d2 and the semiconductor substrate W1, in the case that there is a gap d2 between the flash lamps 11.

If a member that blocks the light emitted from the flash lamps 11 is disposed between the flash lamps 11 and the first main surface W1a of the semiconductor substrate W1, the light emitted from the flash lamps 11 will not reach the first main surface W1a of the semiconductor substrate W1. This configuration causes the light emitted from the flash lamps 11 to reach some portions of the first main surface W1a of the semiconductor substrate W1 and not to reach the other portions thereof.

Hence, the LED elements 12 and the light blocking member 14 are disposed outside the flash light irradiation space A3 to enable the light emitted from the flash lamps 11 to uniformly irradiate the first main surface W1a of the semiconductor substrate W1. The light blocking member 14 is disposed between the flash lamps 11 and the LED elements 12 in the direction in which they are apart (i.e., the Z direction in the first embodiment).

The reflector 15 reflects the light emitted from the flash lamps 11 and traveling toward the opposite side (+Z side) of the semiconductor substrate W1 back toward the side (-Z side) of the semiconductor substrate W1.

The above configuration allows the light emitted from the flash lamps 11 to be blocked by the semiconductor substrate W1 or the light blocking member 14, thus hardly irradiating the LED elements 12 since only a small portion of the light passes through the gap d1. Therefore, the LED elements 12 is prevented from being damaged by the light emitted from the flash lamps 11.

In the first embodiment, a plurality of the flash lamps 11 are arranged; however only one flash lamp may be used as long as the intensity of the emitted light is sufficiently high. The reflector 15 may not necessarily be disposed.

Figure 4:
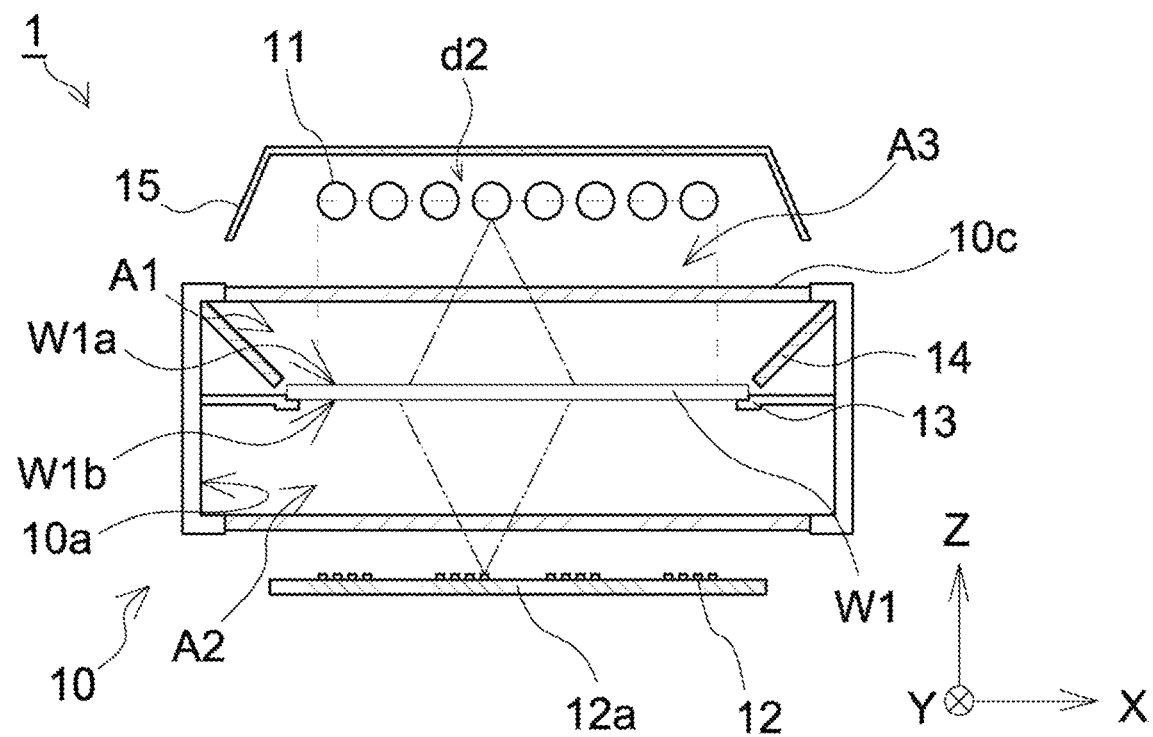
FIG. 4 is a schematic cross-sectional view of an optical heating device illustrating an embodiment.

FIG. 4 is a schematic cross-sectional view of an optical heating device 1 illustrating another embodiment. The light blocking member 14 of the first embodiment is configured to be parallel to the XY plane, as shown in FIG. 1A; however, the light blocking member 14 may be configured to be inclined to the XY plane, as shown in FIG. 4.

Second Embodiment

The configuration of the second embodiment of the optical heating device 1 of the present invention will be described, mainly focusing on the parts that differ from those of the first embodiment.

Figure 5A:
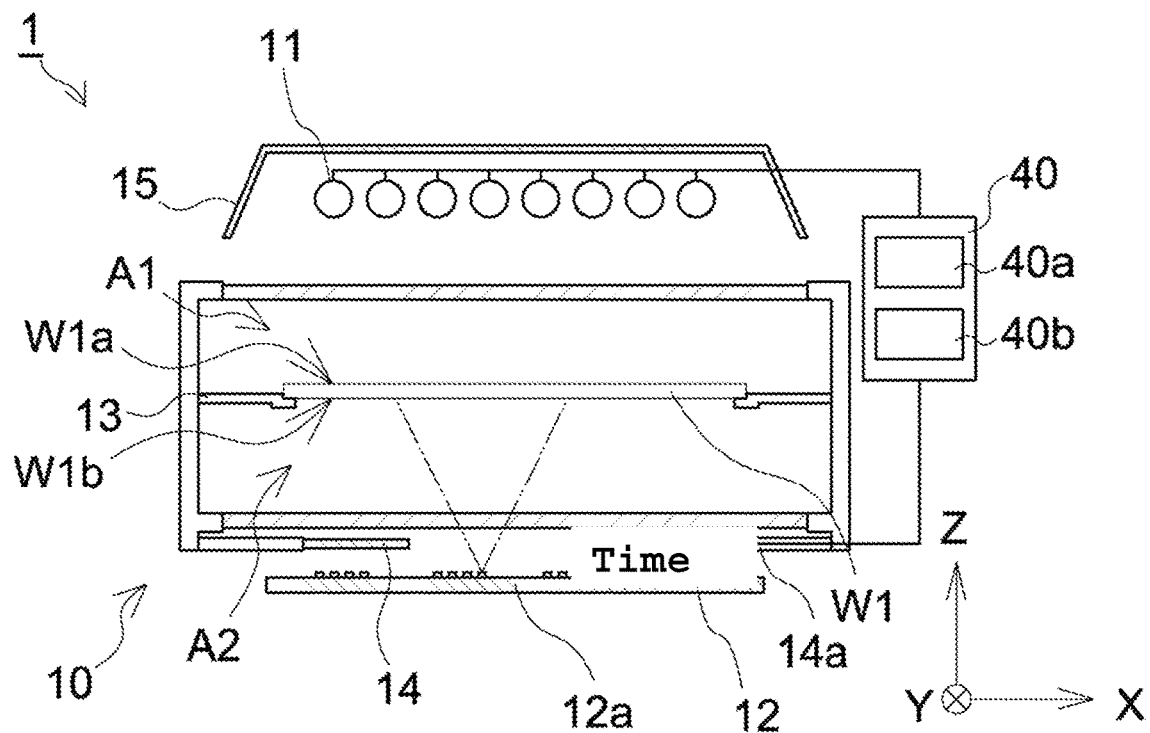
FIG. 5A is a schematic cross-sectional view of an optical heating device illustrating an embodiment.

FIG. 5A is a schematic cross-sectional view of an optical heating device 1 illustrating an embodiment. In the optical heating device 1 of the second embodiment, a light blocking member 14 is disposed between the semiconductor substrate W1 and the LED elements 12 in the Z direction. The light blocking member 14 of the second embodiment is configured to be openable and closable.

Figure 5B:
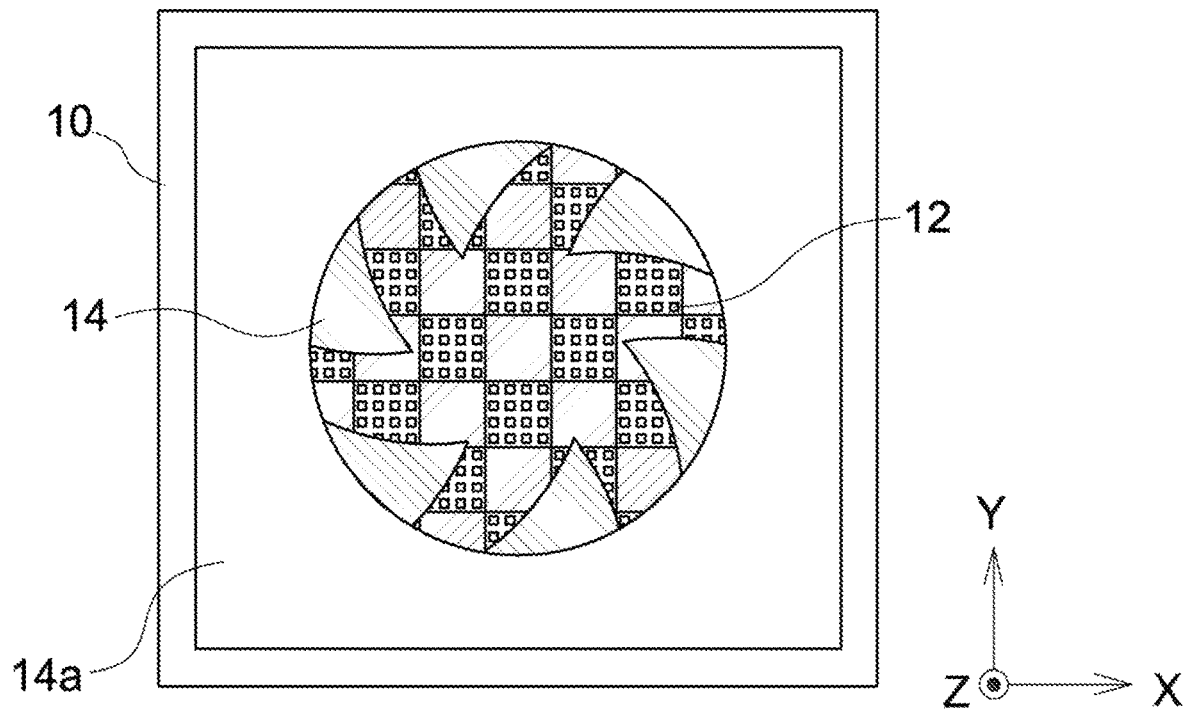
FIG. 5B is a plan view illustrating a state in which the light blocking member provided in the optical heating device in FIG. 5A is in the process of opening or closing, viewed from the +Z side.
Figure 5C:
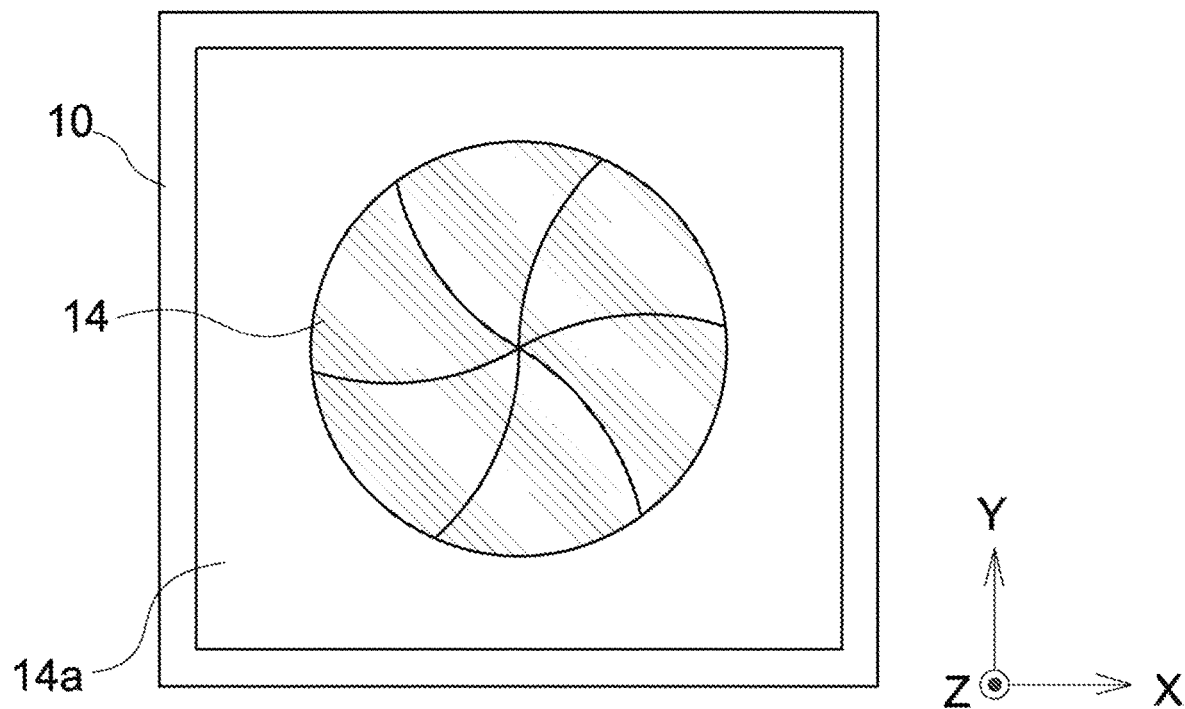
FIG. 5C is a plan view illustrating a state in which the light blocking member provided in the optical heating device in FIG. 5A is closed, viewed from the +Z side.

FIG. 5B is a plan view illustrating a state in which the light blocking member 14 provided in the optical heating device 1 in FIG. 5A is in the process of opening or closing, viewed from the +Z side. FIG. 5C is a plan view illustrating a state in which the light blocking member 14 provided in the optical heating device 1 in FIG. 5A is closed, viewed from the +Z side. The light blocking member 14 of the second embodiment is configured to be openable and closable in a manner similar to the shutter of a camera, as shown in FIGS. 5B and 5C.

The optical heating device 1 of the second embodiment is provided with a control section 40, as shown in FIG. 5A. The control section 40 includes a lighting control unit 40a that controls the lighting of the flash lamps 11 and an opening/closing control unit 40b that controls the opening and closing of the light blocking member 14.

When the semiconductor substrate W1 is placed in the chamber 10, preheating with the LED element 12 starts. When the predetermined time required for preheating has elapsed, the opening/closing control unit 40b controls the light blocking member 14 to close before the lighting control unit 40a executes the lighting control of the flash lamps 11.

After the light blocking member 14 is closed, the lighting control unit 40a executes the lighting control of the flash lamp 11, the light emitted from the flash lamps 11 is irradiated toward the semiconductor substrate W1. The LED elements 12 may be lit or unlit at this time.

The above configuration allows the light blocking member 14 to divide the space A1 that the light emitted from the flash lamps 11 irradiates, from the space A2 that the light emitted from the LED elements 12 irradiates, when the flash lamps 11 are lit. In other words, among the light emitted from the flash lamps 11, the light that does not irradiate the semiconductor substrate W1 and instead passes through around the semiconductor substrate W1 is blocked by the light blocking member 14 and fails to reach the space A2. Therefore, the light emitted from the flash lamps 11 does not irradiate the LED elements 12, preventing the LED elements 12 from being damaged.

In the above description, the light blocking member 14 is configured, like the shutter of a camera, to be opened and closed by the opening/closing control unit 40b, as shown in FIGS. 5B and 5C; however, the light blocking member 14 can be any other configurations, for example, a single plate member moving for opening and closing. In the second embodiment, while the LED elements 12 irradiate light onto the second main surface W1b of the semiconductor substrate W1, a housing section 14a is provided in the chamber 10 to accommodate the light blocking member 14. However, a slit may be provided in the wall of the chamber 10 to insert and retract the light blocking member 14 instead of the housing section 14a provided in the chamber 10.

Figure 6A:
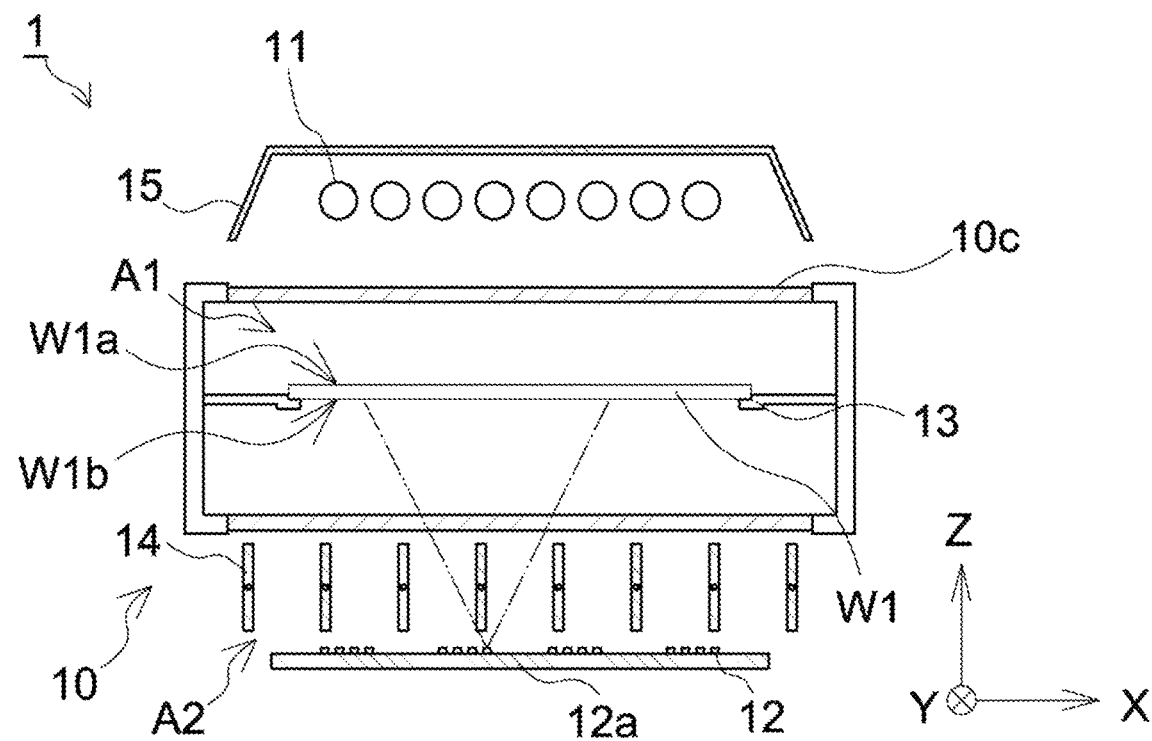
FIG. 6A is a schematic cross-sectional view of an optical heating device illustrating a state in which a light blocking member is open.
Figure 6B:
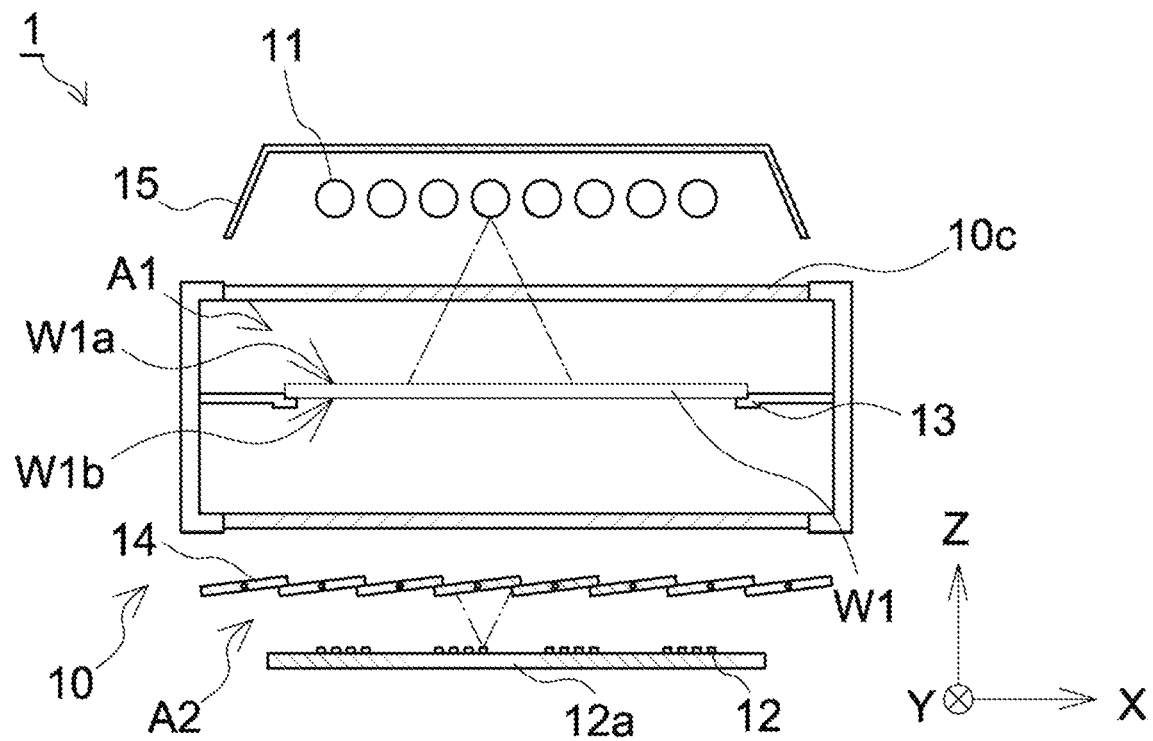
FIG. 6B is a schematic cross-sectional view of an optical heating device in FIG. 6A, illustrating a state in which the light blocking member is closed.

FIGS. 6A and 6B is schematic cross-sectional views of another embodiment of an optical heating device illustrating a state in which a light blocking member is open and closed, respectively. The light blocking member 14 in this configuration may be configured to open and close like a louver, as shown in FIGS. 6A and 6B.

In this configuration, the opening/closing control unit 40b of the control section 40 is also configured to control the light blocking member 14 to close before the lighting control unit 40a lights the flash lamps 11; however the control section 40 is not shown in FIGS. 6A and 6B.

Third Embodiment

The configuration of the third embodiment of the optical heating device 1 of the present invention will be described, mainly focusing on the parts that differ from those of the first and the second embodiments.

Figure 7:
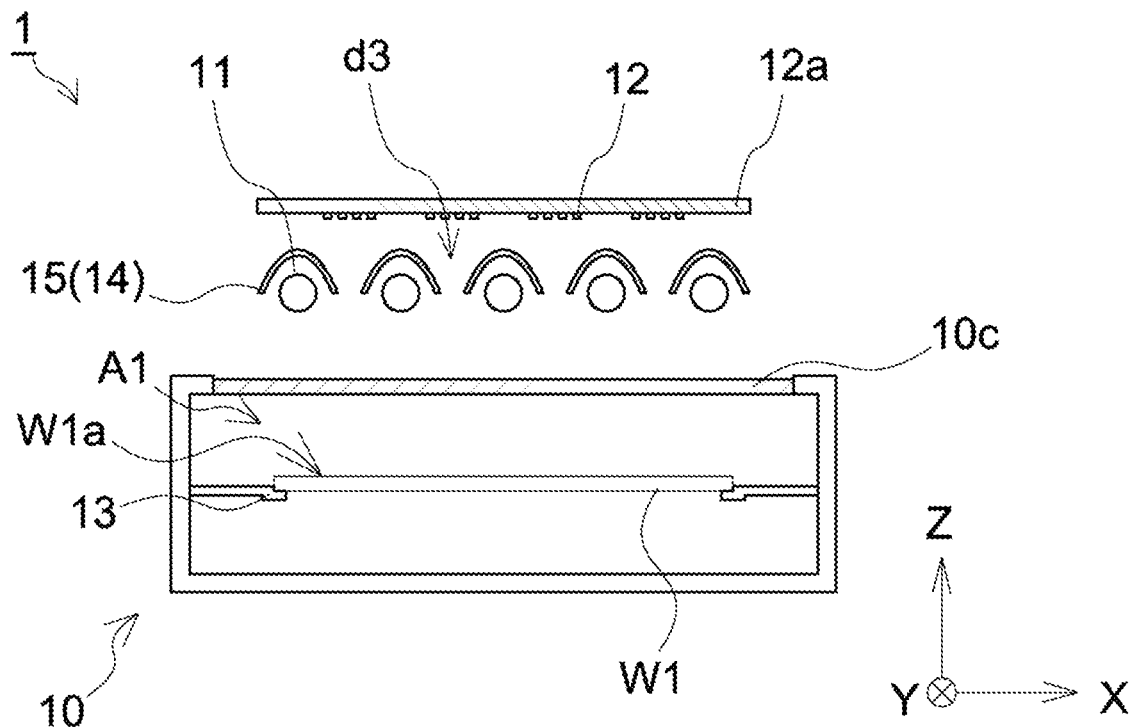
FIG. 7 is a schematic cross-sectional view of an optical heating device illustrating an embodiment.

FIG. 7 is a schematic cross-sectional view of an optical heating device illustrating an embodiment. As shown in FIG. 7, in the third embodiment of the optical heating device 1, the LED elements 12 are arranged further to the +Z side from the flash lamps 11.

Each of the flash lamps 11 is provided with a reflector 15 individually. The reflectors 15 reflect the light emitted from the flash lamps 11 to travel toward the side of semiconductor substrate W1, and also block the light emitted from the flash lamps 11 from traveling directly toward the LED elements 12. In other words, the reflectors 15 in the third embodiment constitute the light blocking member 14.

The LED elements 12 irradiate their light to the first main surface W1a of the semiconductor substrate W1 through a gap d3 between the reflectors 15 arranged in the X direction.

The above configuration prevents the light emitted from the flash lamps 11 from directly irradiating the LED elements 12, thus preventing the LED elements 12 from being damaged by the light emitted from the flash lamps 11.

In addition, this configuration allows the flash lamps 11 and LED elements 12 to be disposed in close proximity to each other in the same space, making the entire optical heating device 1 more compact.

Fourth Embodiment

The configuration of the fourth embodiment of the optical heating device 1 of the present invention will be described, mainly focusing on the parts that differ from those of the first, the second and the second embodiments.

Figure 8A:
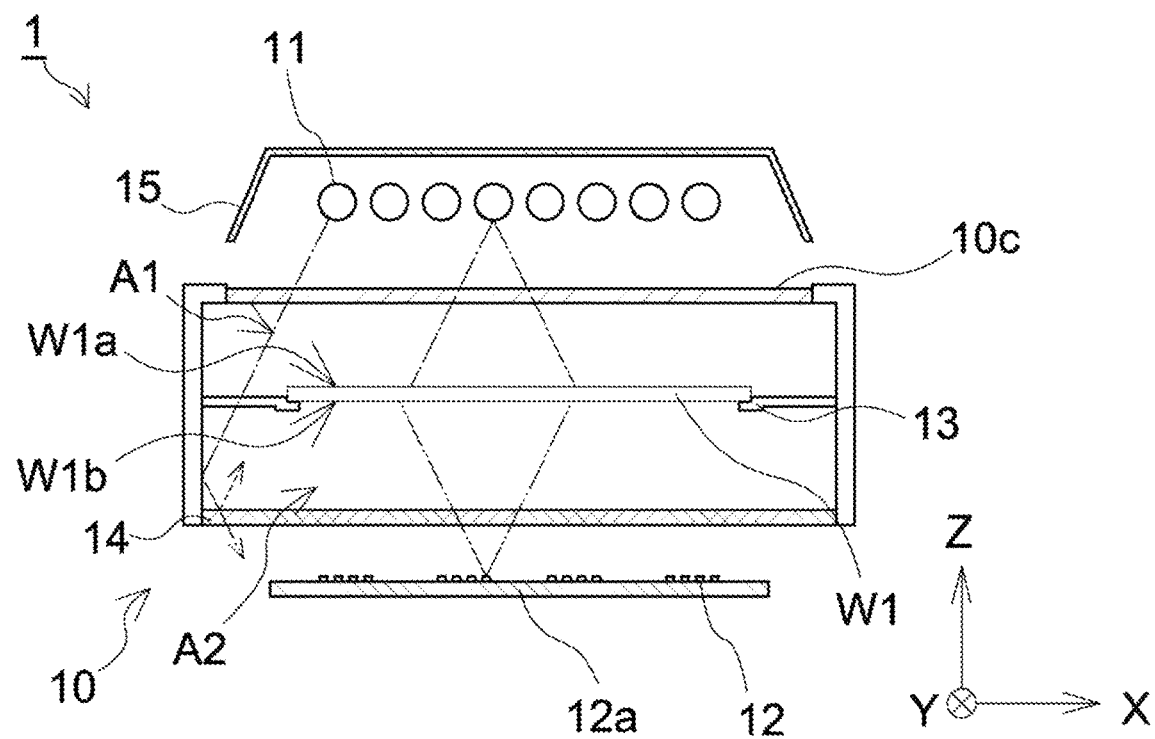
FIG. 8A is a schematic cross-sectional view of an optical heating device illustrating an embodiment.
Figure 8B:
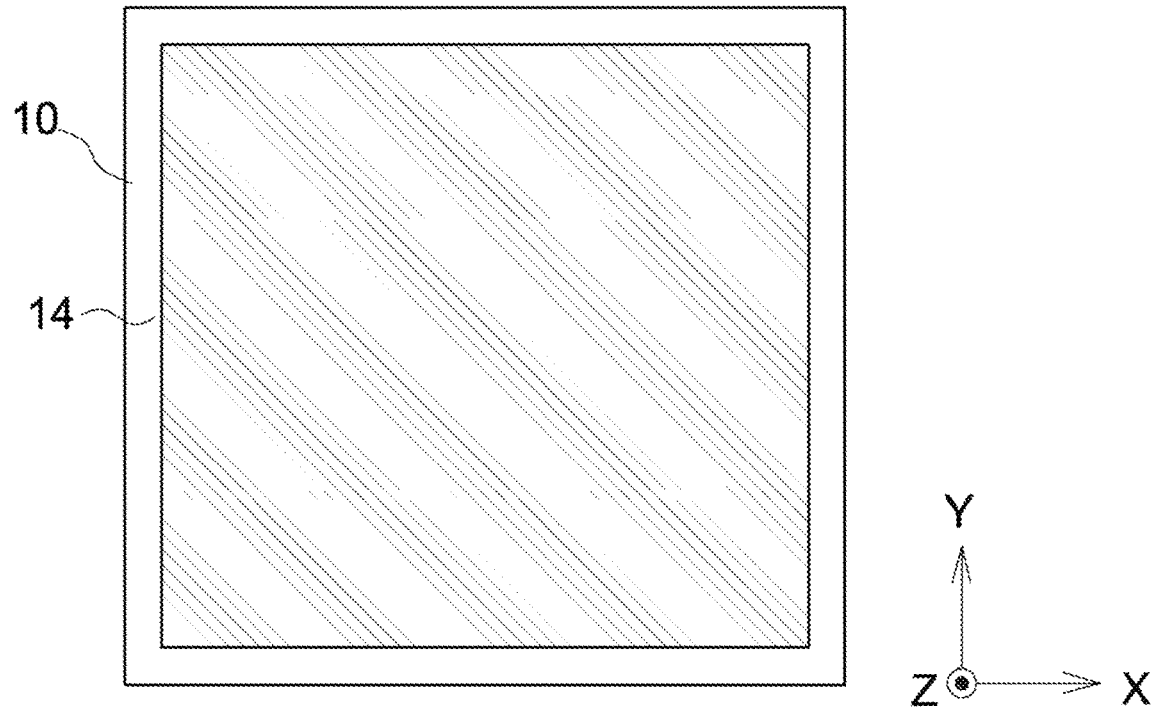
FIG. 8B is a plan view of the light blocking member of the optical heating device in FIG. 8A, viewed from the +Z side.

FIG. 8A is a schematic cross-sectional view of an optical heating device 1 illustrating an embodiment. FIG. 8B is a plan view of the light blocking member 14 of the optical heating device in FIG. 8A, as viewed from the +Z side. As shown in FIG. 8A, the light blocking member 14 of the fourth embodiment is configured to divide the space A1 from the space A2, and to transmit light with around the main emission wavelength of the light emitted from the LED elements 12.

More specifically, the light blocking member 14 is a glass plate having a dielectric multilayer film thereon to transmit light in a predetermined wavelength range and reflect light in the other wavelength ranges. The dielectric multilayer film is, for example, a film stacking multiple layers of $ZrO_2$ and $SiO_2$, and is configured to block light outside the wavelength range of ±50 nm with respect to the main emission wavelength of the LED elements 12.

The "main emission wavelength" here refers to the wavelength with the highest intensity of the emitted light in the emission spectrum.

Figure 9:
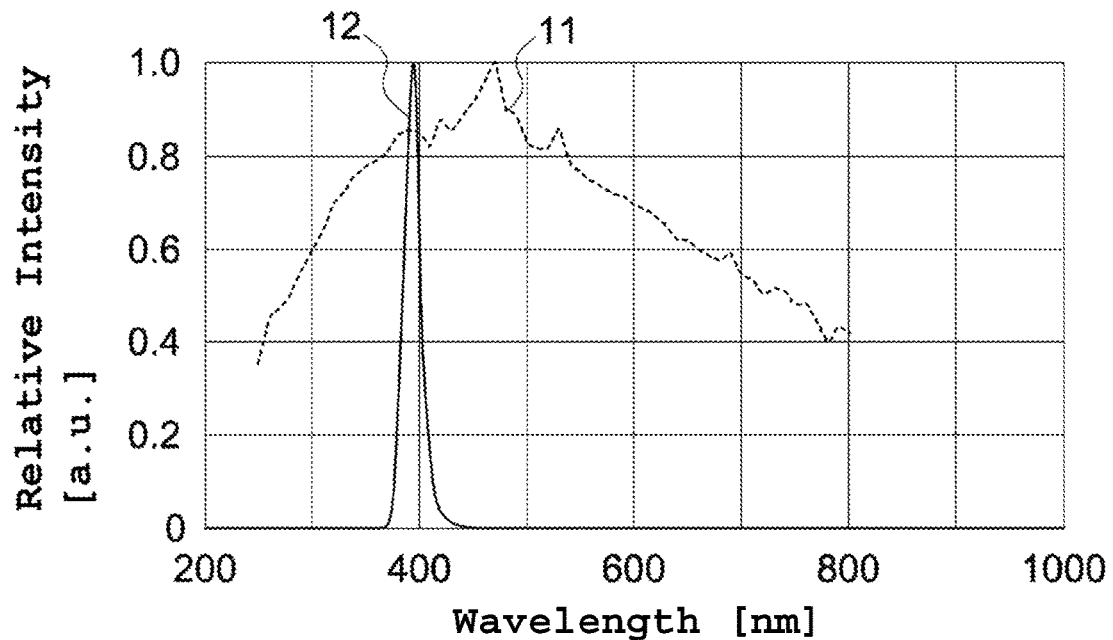
FIG. 9 is a graph illustrating the spectrum of light emitted from a flash lamp and an LED element.

The spectrum of the flash lamps 11 and the LED elements are described here. FIG. 9 is a graph illustrating the spectrum of light emitted from the flash lamps 11 and the LED elements 12, wherein the relative intensity being normalized by 1 with the light intensity at the peak wavelength.

As indicated in a solid line in FIG. 9, the light emitted from the LED elements 12 has an emission spectrum with a main emission wavelength of 398 nm and a wavelength bandwidth of less than 50 nm, the wavelength bandwidth being defined as a wavelength where the relative intensity to the peak light intensity is more than 50%. In contrast, as indicated in a dashed line, the light emitted from the flash lamps 11 has a broad emission spectrum with an emission wavelength band of 1000 nm or more.

In the above configuration, among the light emitted from the flash lamps 11, light with only a small portion of the wavelength range of the total spectrum reaches the LED elements 12. Hence, the light emitted from the flash lamps 11 does not reach the LED elements 12 with maintaining a high energy that would damage the LED elements 12. Therefore, this configuration prevents the LED elements 12 from being overheated and damaged due to the light emitted from the flash lamps 11.

As shown in FIGS. 8A and 8B, the light blocking member 14 of the fourth embodiment is configured to completely divide the space A1 from the space A2 without any gap when viewed from the Z direction; however, it does not necessarily have to be configured without any gap. For example, a hole may be provided near the center of light blocking member 14, where the light emitted from the flash lamps 11 is sufficiently blocked by the semiconductor substrate W1, thus the light emitted from the LED elements 12 is not attenuated even slightly.

The light blocking member 14 of the first through the third embodiments described with reference to FIGS. 1 through 7 may be composed of a glass material having a dielectric multilayer film formed thereon.

Figure 10A:
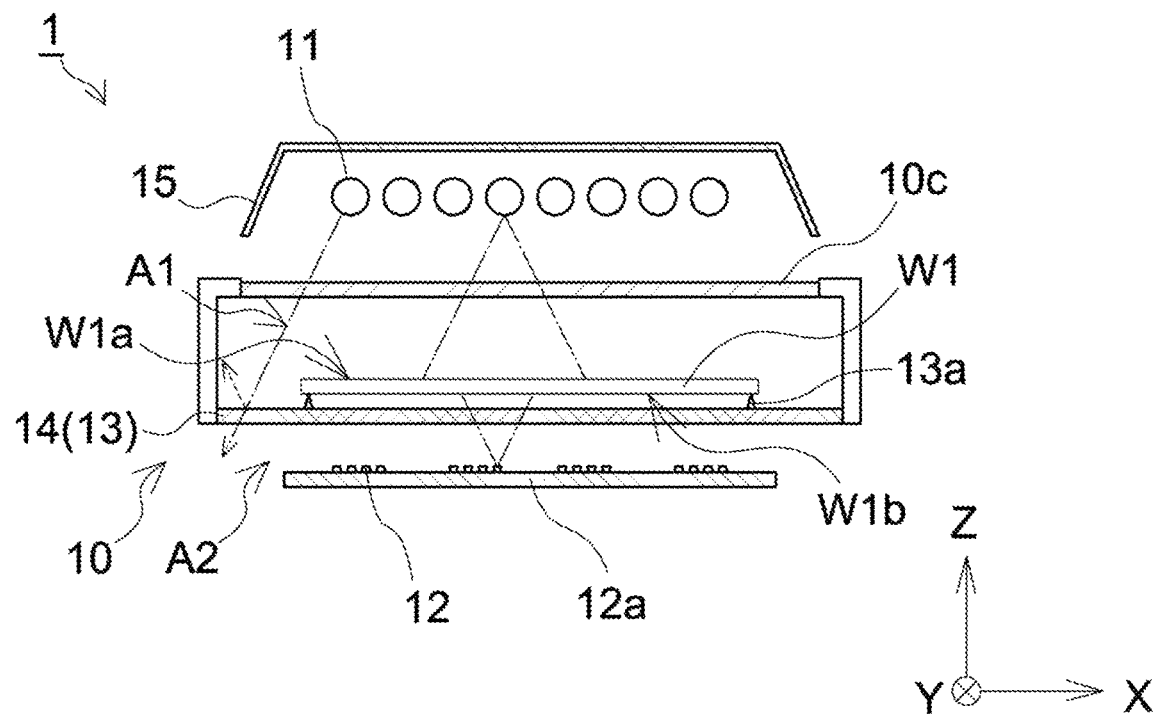
FIG. 10A is a schematic cross-sectional view of an optical heating device illustrating an embodiment.
Figure 10B:
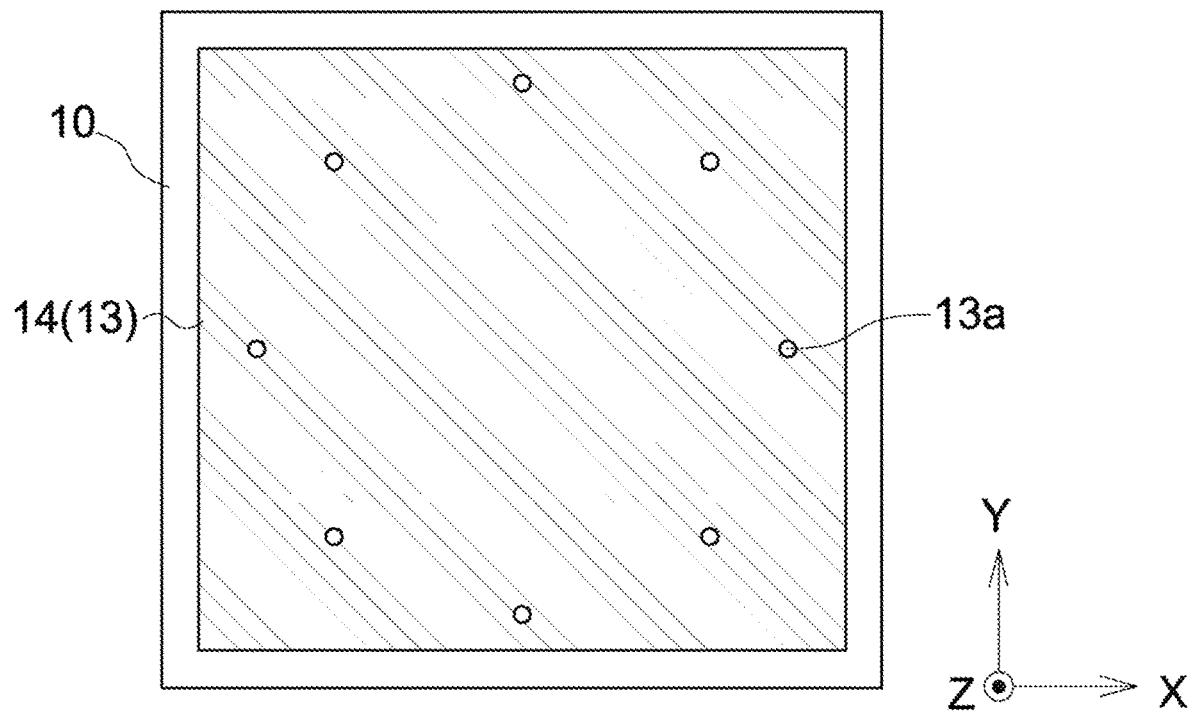
FIG. 10B is a plan view of the light blocking member of the optical heating device in FIG. 10A, viewed from the +Z side.
Figure 11:
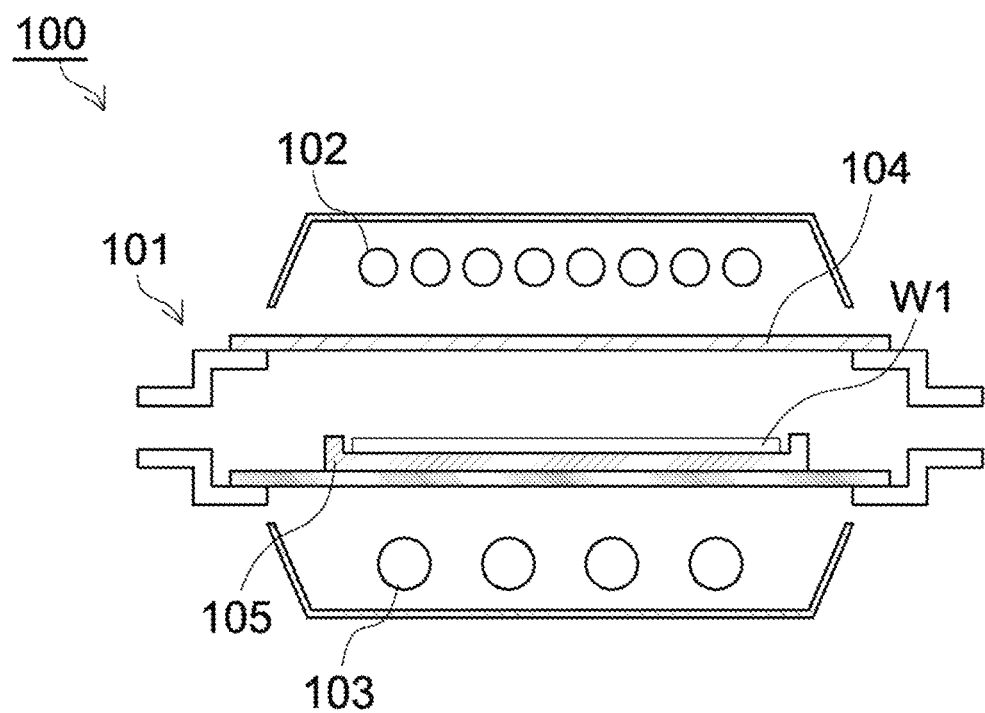
FIG. 11 is a schematic cross-sectional view of a conventional optical heating device provided with a flash lamp and a halogen lamp.

FIG. 10A is a schematic cross-sectional view of an optical heating device 1 illustrating an embodiment. FIG. 10B is a plan view of the light blocking member 14 of the optical heating device 1 in FIG. 10A as viewed from the +Z side. As shown in FIGS. 10A and 10B, the light blocking member 14 of the fourth embodiment may be configured to have protrusions 13a that support the semiconductor substrate W1 on their tips, and provide the function of a support member 13.

Another Embodiment

Hereinafter, another embodiment will be described.

<1> The optical heating device 1 may be provided with an optical system including a lens, a prism, a diffuser plate or an integrator optical system, to irradiate uniformly the entire main surface (W1a, W1a) of the semiconductor substrate W1 with the light emitted from the LED elements 12. This configuration also allows the main surface (W1a, W1b) of the semiconductor substrate W1 to be irradiated with the light emitted from the LED elements 12 by bypassing the flash lamps 11 and the light blocking members 14.

<2> The configuration of the optical heating device 1 described above is merely an example, and the present invention is not limited to each configuration shown in the figures.

What is claimed is:

1. An optical heating device for heating a substrate, the optical heating device comprising:
   a chamber for accommodating the substrate;
   a support member for supporting the substrate in the chamber;
   a flash lamp disposed to face a first main surface of the substrate supported by the support member;
   a plurality of LED elements for emitting light from outside a flash light irradiation space that is sandwiched between the substrate supported by the support member and the flash lamp, the light traveling toward the first main surface of the substrate or a second main surface of the substrate that is the opposite side of the first main surface; and
   a light blocking member disposed between the flash lamp and the plurality of LED elements in a separating direction, and outside the flash light irradiation space, for blocking the light emitted from the flash lamp and traveling toward the plurality of the LED elements,
   wherein the flash light irradiation space is free from the light blocking member for blocking the light emitted from the flash lamp and traveling toward the plurality of the LED elements, and
   the light blocking member is a glass material with a dielectric multilayer film formed on its surface, and the dielectric multilayer film is configured to block light emitted from the flash lamp outside a wavelength range of +50 nm with respect to the main emission wavelength of the LED elements.

2. The optical heating device according to claim 1, wherein the plurality of the LED elements are arranged to emit light toward the second main surface of the substrate, and the light blocking member is disposed between the substrate supported by the support member and the LED elements.

3. The optical heating device according to claim 1, wherein the plurality of the LED elements are arranged to emit light toward the second main surface of the substrate, and the light blocking member is disposed to communicate the side surface of the substrate supported by the support member with the inner wall surface of the chamber.

4. The optical heating device according to claim 1, further comprising an opening/closing controller for controlling the light blocking member to close before the flash lamp is lit,
   wherein the plurality of the LED elements are arranged to emit light toward the second main surface of the substrate; and
   the light blocking member is disposed between the substrate supported by the support member and the plurality of the LED elements, is a member that is openable and closable, and is configured to switch over between a state in which light is allowed to pass through and a state in which light is blocked by opening and closing the light blocking member.

5. The optical heating device according to claim 2, further comprising an opening/closing controller for controlling the light blocking member to close before the flash lamp is lit,
   wherein the plurality of the LED elements are arranged to emit light toward the second main surface of the substrate; and
   the light blocking member is disposed between the substrate supported by the support member and the plurality of the LED elements, is a member that is openable and closable, and is configured to switch over between a state in which light is allowed to pass through and a state in which light is blocked by opening and closing the light blocking member.

* * * * *